(12) United States Patent
Maki

(10) Patent No.: US 7,075,836 B2
(45) Date of Patent: Jul. 11, 2006

(54) SEMICONDUCTOR MEMORY HAVING TESTABLE REDUNDANT MEMORY CELLS

(75) Inventor: Takashi Maki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/044,016

(22) Filed: Jan. 28, 2005

(65) Prior Publication Data

US 2006/0044897 A1   Mar. 2, 2006

(30) Foreign Application Priority Data

Sep. 2, 2004   (JP) ............................. 2004-256045

(51) Int. Cl.
*G11C 29/00* (2006.01)
*G11C 7/00* (2006.01)

(52) U.S. Cl. .................. 365/200; 365/201; 365/230.03
(58) Field of Classification Search ................ 365/200, 365/230.03
See application file for complete search history.

(56) References Cited

U.S. PATENT DOCUMENTS 5,930,183 A   7/1999 Kojima et al.

6,741,509 B1 * 5/2004 Kato et al. ............. 365/230.03
6,754,115 B1 * 6/2004 Sugita ........................ 365/201
6,999,357 B1 * 2/2006 Tanishima et al. .......... 365/200

FOREIGN PATENT DOCUMENTS

| JP | 05-307896 | 11/1993 |
|----|-----------|---------|
| JP | 06-243698 | 9/1994 |
| JP | 10-334689 | 12/1998 |

* cited by examiner

Primary Examiner—Huan Hoang
(74) Attorney, Agent, or Firm—Arent Fox PLLC

(57) ABSTRACT

A semiconductor memory having a plurality of normal memory blocks and a redundant memory block, has a redundant replacement memory that stores identification information for a normal memory block that is a replacement target; a select signal generation unit that generates a block select signal on the basis of the redundant replacement memory identification information in response to a memory reset signal that is inputted to a reset terminal; and a memory block selection unit that selects the redundant memory block and enables input/output access thereto in place of the replacement-target normal memory block on the basis of the block select signal, wherein the memory block selection unit selects the redundant memory block in place of any normal memory block in response to a redundant select signal which is inputted to the reset terminal and differs from the memory reset signal.

12 Claims, 7 Drawing Sheets

CONSTITUTIONAL VIEW OF SEMICONDUCTOR MEMORY

FIG. 2
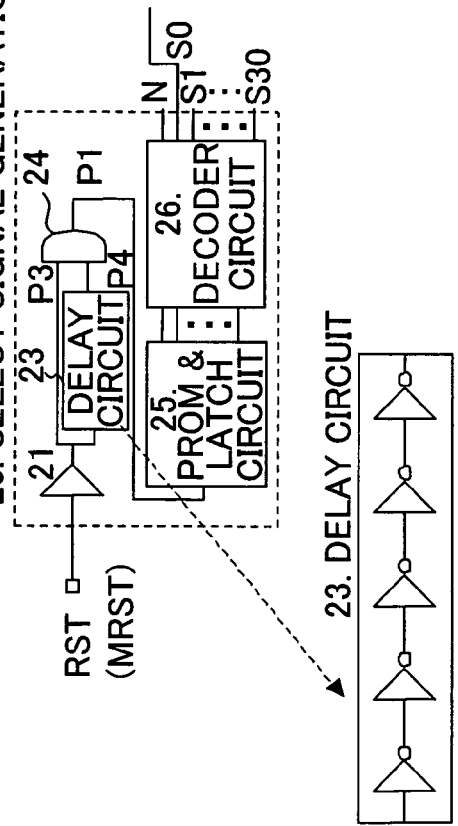
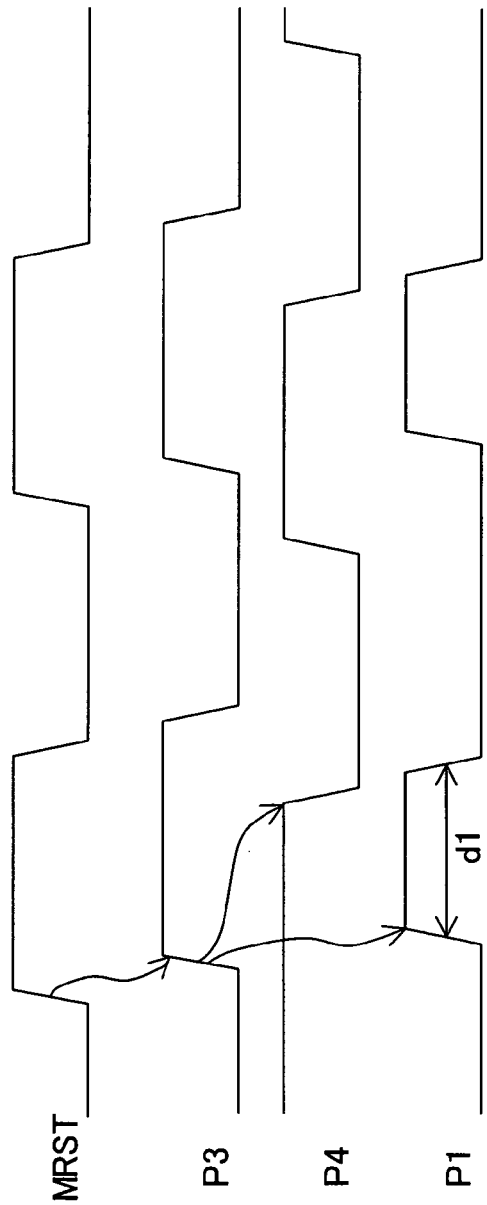

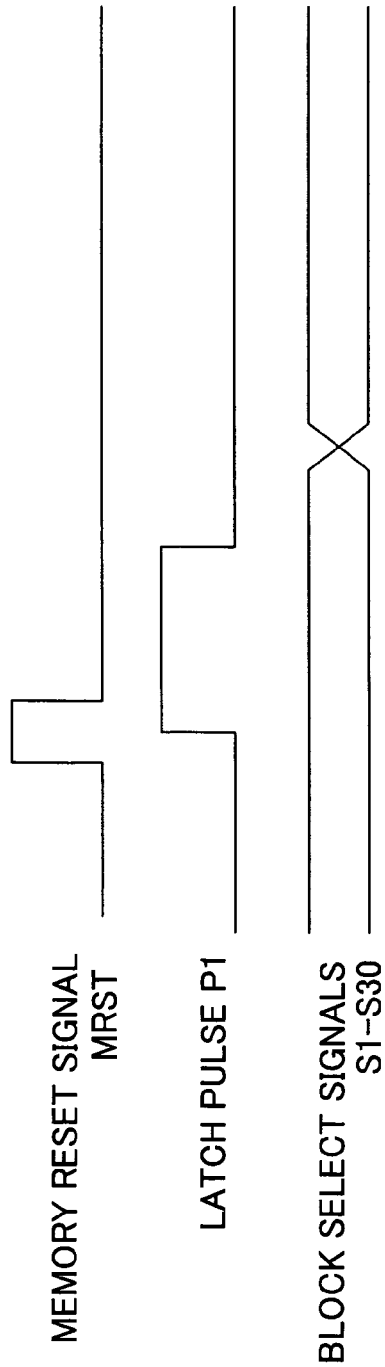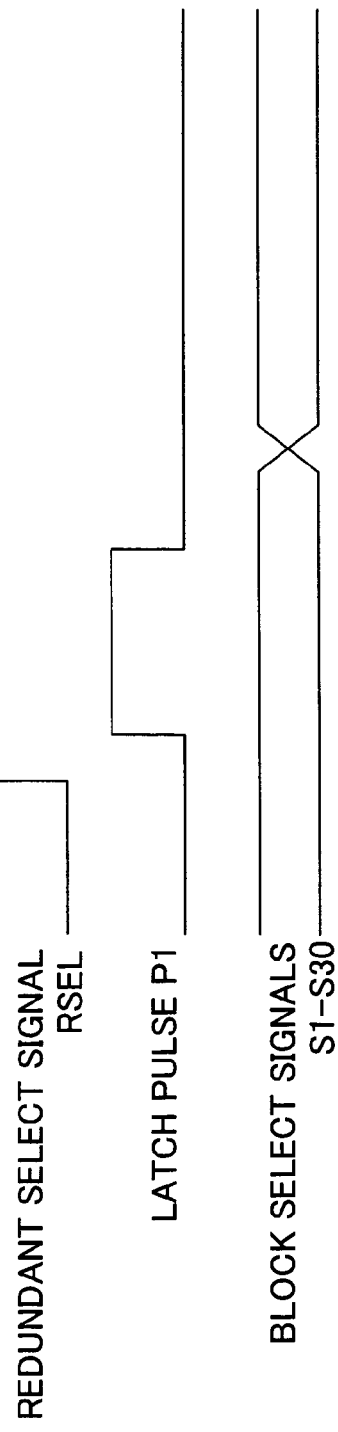

SEMICONDUCTOR MEMORY HAVING TESTABLE REDUNDANT MEMORY CELLS

CROSS-REFERENCE TO RELATED APPLICATIONS

This application is based upon and claims the benefit of priority from the prior Japanese Patent Application No. 2004-256045, filed on Sep. 2, 2004, the entire contents of which are incorporated herein by reference.

BACKGROUND OF THE INVENTION

1. Field of the Invention

The present invention relates to a semiconductor memory having testable redundant memory cells and, more particularly, to a semiconductor memory that enables testing of read and write operations with respect to the redundant memory cells of a redundant memory block even before a normal memory cell block with a fault is replaced with a redundant memory block.

2. Description of the Related Art

As a method of relieving defects of a semiconductor memory, a method that entails providing a normal memory cell array and a redundant memory cell array, performing operation tests in a wafer state (primary tests), storing defective cell addresses and so forth in a redundant replacement memory consisting of a PROM with fuses once a defect is detected to replace the defective normal memory cell array with a redundant memory cell array is known. Although a memory chip that has been relieved in this manner becomes a semiconductor memory device after an assembly step in which the memory chip is stored in a package or the like, an operation test (secondary test) is performed in this device state. The cause of a fault in the secondary test is sometimes the occurrence of a fault in the assembly step and sometimes the existence of a fault in the redundant memory cell array that has replaced the normal memory cell array.

Therefore, if a check of whether a fault exists in the redundant memory cell array can be made at the primary test stage, it is possible to eliminate writing to the redundant replacement memory and the following assembly step. Therefore, a method in which an operation test on the redundant memory cell array is permitted at the primary test stage without writing to the redundant replacement memory has been proposed in Japanese Patent Application Laid Open Nos. H05-307896 and H06-243698, for example. These patent documents describe a method in which inputs and outputs to the redundant memory array are enabled by supplying a special signal from the outside without writing relief information to the redundant replacement memory.

In recent years, it has been actively pursued to embed a semiconductor memory in large-scale LSIs such as system LSIs. In this case, the semiconductor memory becomes a memory module. Thus, a primary test must be executed to the semiconductor memory embedded in the LSI and, for reasons similar to those mentioned above, an operation test on the redundant memory array must also be performed in the primary test.

However, according to the methods described in Japanese Patent Application Laid Open Nos. H05-307896 and H06-243698, a special signal must be supplied from the outside in order to enable access to the redundant memory array. Thus, the provision of a special signal in order to access the redundant memory array at the primary test stage necessitates the addition of signal wiring to the memory module, which is undesirable. Further, also in the case of a unit semiconductor memory device, a special terminal for accessing the redundant memory block must be provided, which is disadvantageous.

On the other hand, a semiconductor memory generates a power-on reset signal upon detecting power-on internally and initializes the redundant replacement memory and so forth by means of the power-on reset signal. However, because there are variations in the speed at which the semiconductor memory is powered up at power-on, the internal generation of this power-on reset signal is sometimes not necessarily preferable. In such a case, instead of installing a power-on reset signal generation circuit, a reset signal must be supplied to the memory from the system side and this reset signal must be used to perform in-memory initialization.

SUMMARY OF THE INVENTION

It is therefore an object of the present invention to provide a semiconductor memory that enables access to a redundant memory array without writing to the redundant replacement memory and without using a special external signal.

It is a further object of the present invention to provide a semiconductor memory that enables access to the redundant memory array by combining usage of existing external signals without writing to the redundant replacement memory.

In order to achieve the above object, according to a first aspect of the present invention, a semiconductor memory having a plurality of normal memory blocks and a redundant memory block, comprising a redundant replacement memory that stores identification information for a normal memory block that is a replacement target; a select signal generation unit that generates a block select signal on the basis of the redundant replacement memory identification information in response to a memory reset signal that is inputted to a reset terminal; and a memory block selection unit that selects the redundant memory block and enables input/output access thereto in place of the replacement-target normal memory block on the basis of the block select signal, wherein the memory block selection unit selects the redundant memory block in place of any normal memory block in response to a redundant select signal which is inputted to the reset terminal and differs from the memory reset signal.

According to the first aspect above, in a preferred embodiment, when the redundant replacement memory is in an initial state, the redundant replacement memory does not store the identification information; the select signal generation unit generates the block select signal that does not direct replacement with the redundant memory block; and the memory block selection unit does not select the redundant memory block on the basis of the block select signal that does not direct the replacement. In the initial state, the memory block selection unit enables access to the redundant memory block by selecting the redundant memory block in response to the redundant select signal that is inputted to the reset terminal.

According to the first aspect above, in a preferred embodiment, the select signal generation unit generates the block select signal on the basis of the redundant replacement memory identification information in response to the redundant select signal in addition to the memory reset signal. That is, in response to the redundant select signal, the select signal generation unit generates the block select signal on the basis of redundant replacement memory identification information in the same way as when a normal reset is performed, on the other hand the memory block selection unit selects the redundant memory block and enables access thereto. Therefore, a normal memory block can be accessed by inputting the memory reset signal to the reset terminal and the redundant memory block can be accessed by inputting the redundant select signal to the reset terminal. Accordingly, in the primary test step, an operation test for the normal memory blocks and an operation test for the redundant memory block can be performed on the basis of the signals inputted to the reset terminal.

According to the first aspect of the present invention, a reset terminal to which a memory reset signal is inputted when resetting is performed such as when the power supply is turned on is used and a redundant select signal is inputted to the reset terminal, whereby input/output access to the redundant memory block can be enabled and an operation test for the redundant memory block can be permitted. Further, in response to the redundant select signal, the select signal generation unit generates a block select signal that does not direct the replacement with the redundant memory block and therefore, irrespective of the block select signal, the memory block selection unit is able to select the redundant memory block and render same accessible.

BRIEF DESCRIPTION OF THE DRAWINGS

FIG. 2 illustrates the operation of pulse generation circuits 23, 24 in a selection signal generation unit 20;

FIG. 3, including FIG. 3A and FIG. 3B, is an operation waveform of the semiconductor memory of this embodiment;

FIG. 5, including

DESCRIPTION OF THE PREFERRED EMBODIMENTS

An embodiment of the present invention will be described hereinbelow with reference to the drawings. However, the technical scope of the present invention is not limited to or by the embodiment but instead covers the items appearing in the claims as well as any equivalents thereof.

Figure 1:
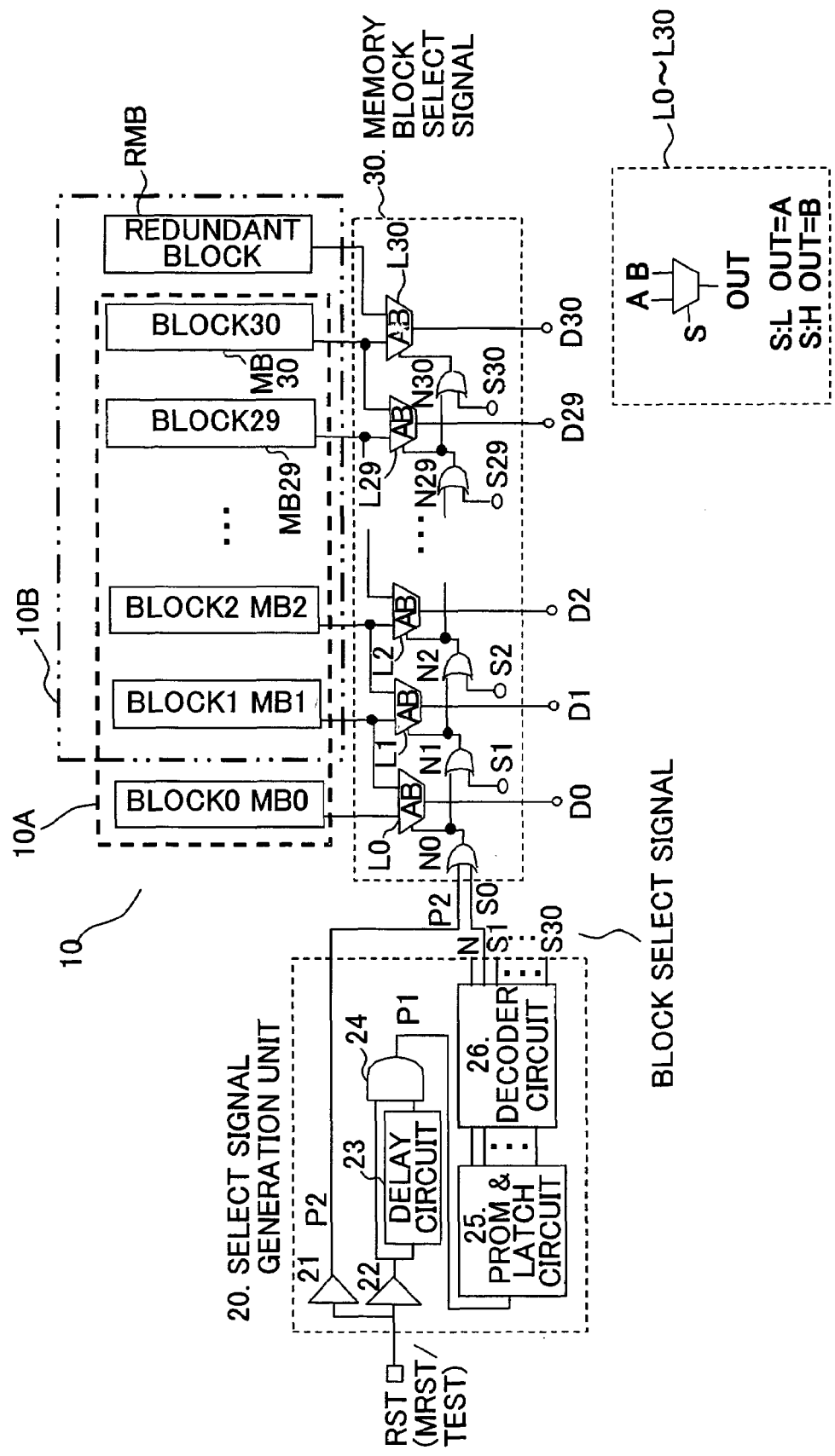
FIG. 1 is a constitutional view of the semiconductor memory of this embodiment.

FIG. 1 is a constitutional view of the semiconductor memory of this embodiment. This semiconductor memory comprises a memory core 10 that has a plurality of memory blocks, a select signal generation unit 20 that generates memory block select signals N and S1 to S30 and a memory block selection unit 30 that selects memory blocks on the basis of memory block select signals and enables input/output access to the memory blocks. The memory core 10 comprises normal memory blocks MB0 to MB30 and a redundant memory block RMB, which each have a memory cell array. The select signal generation unit 20 comprises a pulse generation circuit that is connected to the reset terminal RST and comprises buffers 21 and 22, a delay circuit 23, and an AND gate 24; a PROM, which is a redundant replacement memory; a redundant replacement memory latch circuit 25 that latches PROM information in response to a latch pulse signal P1; and a decoder circuit 26 that decodes the latched signals and generates block select signals N, S1 to S30. Further, the memory block selection unit 30 comprises NOR gates N0 to N30 and selectors L0 to L30, selects a combination 10A of only the normal memory blocks or a combination of the normal memory blocks and the redundant memory block on the basis of memory block select signals S0 to S30, and enables access via the input/output terminals D0 to D30 to the selected blocks. The selectors L0 to L30 are circuits that select and output inputs A or B to the output OUT in correspondence with the low level and high level of the select signals S, as per the illustration in the broken lines in the bottom right of FIG. 1. That is, a selector selects any of the input/outputs of adjacent memory blocks and connects the input/output to the data terminals D0 to D30. Further, the output of a previous-stage NOR gate is inputted to the subsequent-stage NOR N1–N30 gate together with the memory block select signals S1 to S30. Therefore, when a certain memory block select signal assumes the high level, the outputs of the subsequent-stage NOR gates are consequently all high and the selectors thereof select the input B.

FIG. 2 illustrates the operation of the pulse generation circuits 23 and 24 in the select signal generation unit 20. Before the operation of the semiconductor memory in FIG. 1 is explained, the operation of the select signal generation unit 20 is explained with reference to FIG. 2. The pulse generation circuit comprising the delay circuit 23 and AND gate 24 generates a latch pulse P1 in response to the rising edge of the signal inputted to the reset terminal RST. The delay circuit 23 is constituted by an odd number of inverters as shown in FIG. 2. Therefore, supposing that a memory reset signal MRST is inputted to the reset terminal RST, the buffer circuit 21 supplies a signal P3 to the AND gate 24 and delay circuit 23. In the AND gate 24, the latch pulse P1 assumes the high level in response to the rising edge of the signal P3, the inverted signal P4 that has been delayed by the delay time d1 by the delay circuit 23 is supplied to the AND gate 24, and the latch pulse P1 assumes the low level in response to the rising edge of the inverted signal P4. That is, the latch pulse P1 is generated in response to the rising edge of the signal supplied to the reset terminal RST and has the pulse width of the delay time d1 of the delay circuit 23.

As a result of the latch pulse P1, in the redundant replacement memory latch circuit 25, identification information stored in the redundant replacement memory PROM is latched by the latch circuit. The latch circuit, which latches the information of the redundant replacement memory, is described in the Japanese Patent Application Laid Open No. H10-334689 (U.S. Pat. No. 5,930,183), for example. In this example, the redundant replacement memory stores 5-bit identification information and the latch circuit latches the 5-bit identification information. Further, the decoder 26 decodes 5-bit identification information data and outputs the block select signals N, S0 to S30. When the redundant replacement memory 25 is in the initial state, the 5-bit identification information is all '0', for example, and the decoder output is such that the block select signal N is N=1 (S0 to S30=0). Further, when, as a result of an operation test, a fault is detected in a normal memory block MB2, '00011', for example, is written as 5-bit identification information to the redundant replacement memory PROM, the decoder output is such that the block select signal S2 is S2=1 and the other block select signals N, S0, S1, S3 to S30 are all '0'.

Returning now to FIG. 1, when the redundant replacement memory is in the initial state, the identification information is '00000' and the block select signals of the decoder output are such that N=1 and S to S30=0. Because the block select signal N is not connected and S1 to S30=0, the output of the NOR gate N0 is '0' (low level), the output of the normal memory block MB0 is connected to the data terminal D0 and, likewise, the outputs of the normal memory blocks MB1 to MB30 are connected to the data terminals D1 to D30. That is, only the normal memory block 10A is accessible.

Next, for example, when a fault exists in the normal memory block MB2, identification information '00011' is written to the redundant replacement memory PROM. As a result, the decoder circuit 26 renders the block select signal S2=1 and the other select signals all '0'. As a result, the normal memory blocks MB0 and MB1 are connected to the data terminals D0 and D1, the output of the NOR gate N2 is '1' (high level) as a result of the block select signal S2=1, and the normal memory block MB3 is connected to the data terminal D2. In addition, the outputs of the NOR gates N3 to N30 are also '1' (high level), the normal memory blocks MB4 to MB30 are connected to the data terminals D3 to D29 and the redundant memory block RMB is connected to the data terminal D30. That is, as a result of the normal memory block MB2 in which a fault exists, the right-hand normal memory blocks MB3 to MB30 are then shifted to the left-hand side and connected to the data terminals D2 to D29 and a redundant memory block RMB is connected to the remaining data terminal D30.

As a result of the above constitution, in response to the rising edge of the signal inputted to the reset terminal RST, information of the redundant replacement memory is latched and decoded and the block select signals N, S0 to S30 are generated. Only one of the block select signals N, S0 to S30 assumes the high level and the memory block selection unit 30 selects either a combination 10A of only the normal memory blocks or a combination of the normal memory blocks and the redundant memory block RMB.

In addition, a buffer 21 is provided in the select signal generation unit 20 and a signal that is inputted to the reset terminal RST is inputted to the NOR gate N0 as the internal signal P2 via the buffer 21. If the signal inputted to the reset terminal RST is a high level signal, the internal signal P2 is a high level signal, the output of the NOR gate N0 is a high level signal and the input B of the selector L0 is connected to the output. That is, the normal block MB1 is connected to the data terminal D0 and, likewise, the normal memory blocks MB2 to MB30 and the redundant memory block RMB are connected to the data terminals D1 to D30. That is, the memory block of 10B in FIG. 1 is accessible.

FIG. 3 is an operation waveform diagram of the semiconductor memory of this embodiment. FIG. 3A is an operation waveform during normal operation and at the time of a primary test, and FIG. 3B is an operation waveform at the time of a redundant block test. During normal operation, a memory reset signal MRST with a predetermined pulse width is inputted to the reset terminal RST. In response to the rising edge of the memory reset signal MRST, the latch pulse P1 is generated, redundant replacement memory identification information is latched and decoded in response to the latch pulse P1 and the block select signals S1 to S30 are outputted. Further, on the basis of the block select signals, the selected memory blocks are connected to the data terminals D0 to D30 and become accessible. During normal operation, in an initial state where nothing is written in the redundant replacement memory, the block select signals S0 to S30 are all '0', the normal memory blocks MB0 to MB30 are connected to data terminals D0 to D30 and become accessible. On the other hand, during normal operation, when identification information for a faulty memory block is written in the redundant replacement memory, one of the block select signals S0 to S30 are '1', the normal memory blocks and redundant memory block are connected to the data terminals D0 to D30 and become accessible with the exception of the faulty memory block.

When the redundant memory block is selected and an operation test thereof is performed, a redundant select signal RSEL is inputted to the reset terminal RST as shown in FIG. 3B. The redundant select signal RSEL is a signal that rises from the low level to the high level and retains the high level state. In response to the rising edge of the redundant select signal RSEL, a latch pulse P1 is generated and redundant replacement memory identification information is latched and decoded. At the primary-test stage, because the redundant replacement memory is an initial state where writing is not performed, the decoder output is N=1 and S0 to S30=0. Meanwhile, the redundant select signal RSEL that is inputted to the reset terminal RST retains the high level state. This signal is inputted to the initial-stage NOR gate N0 as the internal signal P2 via the buffer 21. As a result, all the NOR gate outputs are at the high level, the normal memory block MB0 is not selected and the normal memory blocks MB1 to MB30 and redundant memory block RMB are selected and connected to the data terminals D0 to D30 so as to be accessible. That is, the memory block group 10B of FIG. 1 is afforded an accessible state and an operation test on the redundant memory block RMB becomes possible.

Further, even when identification information for any given normal memory block has been written in the redundant replacement memory, by holding the internal signal P2 at the high level, the output of the initial-stage NOR gate N0 is rendered a high level output. Therefore, the outputs of the subsequent-stage NOR gates N1 to N30 are all rendered high level outputs, whereby the memory block group 10B is selected and made accessible as detailed above. Therefore, by inputting the redundant select signal RSEL via the reset terminal RST, the memory block group 10B can be compulsorily afforded a selected state and can be made accessible at the time of a primary test, a secondary test and during normal operation.

Figure 4:
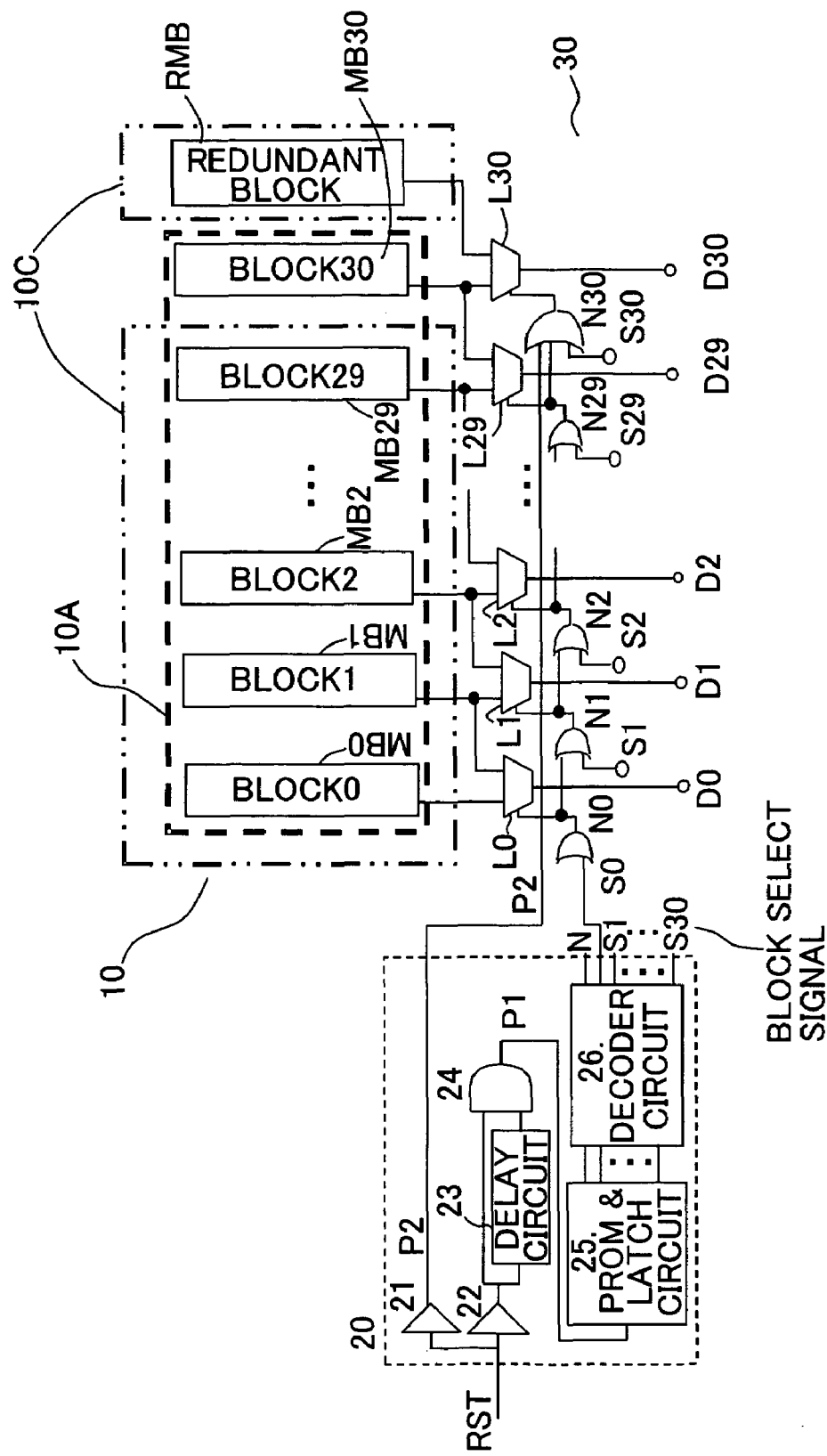
FIG. 4 is a constitutional view of another semiconductor memory of this embodiment.

FIG. 4 is a constitutional view of another semiconductor memory of this embodiment. The semiconductor memory has the same constitution as that in FIG. 1 except for the fact that the constitution of the memory block selection unit 30 differs from the constitution in FIG. 1. In the example in FIG. 4, the internal signal P2 supplied via the buffer 21 is inputted to the final-stage NOR gate N30 in the memory block selection unit 30. That is, the block select signal S30, the output of the previous-stage NOR gate N29 and the internal signal P2 are inputted to the final-stage NOR gate N30, and the selector L30 is controlled by the output from the final-stage NOR gate N30.

In the case of the semiconductor memory in FIG. 4, when the memory reset signal MRST shown in FIG. 3A is inputted to the reset terminal RST during normal operation and at the time of a primary test, the normal memory block group 10A is connected to the data terminals D0 to D30 and becomes accessible. On the other hand, when the redundant select signal RSEL shown in FIG. 3B is inputted to the reset terminal RST, if the redundant replacement memory is in the initial state, the normal memory blocks MB0 to MB29 are connected to the data terminals D0 to D29 and the redundant memory block RMB is connected to the data terminal D30 instead of the normal memory block MB30. That is, a memory block group 10C enters an accessible state. The selection of the redundant memory block is possible even when identification information of some kind is written in the redundant replacement memory. That is, the normal memory block corresponding with the identification information in the redundant replacement memory is replaced with the redundant memory block RMB instead of the replacement-target memory block MB30 in the initial state, which is then rendered accessible.

As can be seen from the constitution of the semiconductor memory in FIG. 4, the internal signal P2 may be inputted to any NOR gate N1–N29 in the memory block selection unit 30. Accordingly, the redundant memory block RMB is invariably afforded an accessible state.

Figure 5A:
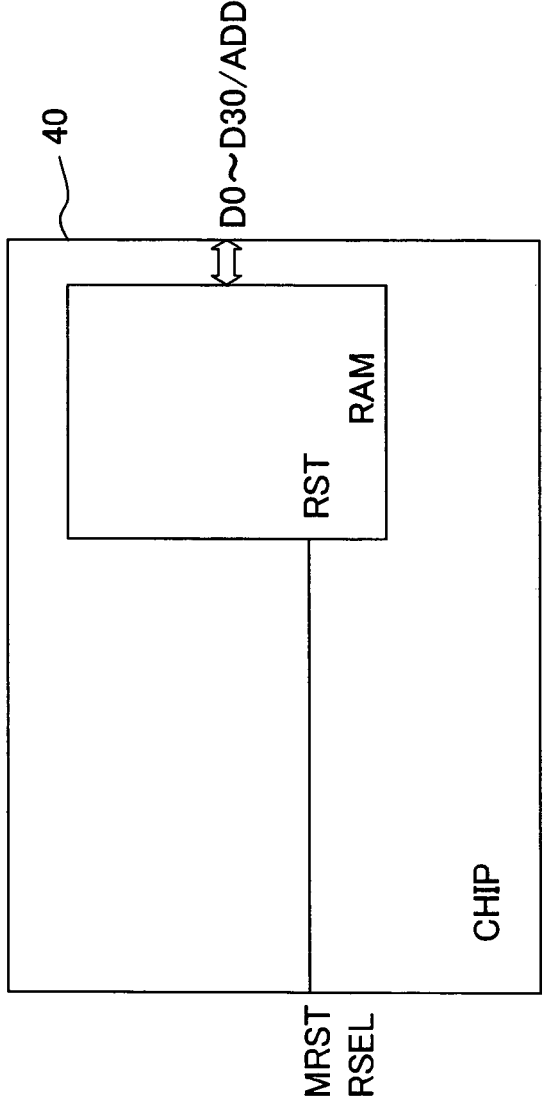
FIG. 5A and FIG. 5B, is a constitutional view of an LSI in which the memory of this embodiment is installed.

FIG. 5 is a constitutional view of an LSI in which the memory of this embodiment is installed. The semiconductor memory shown in FIGS. 1, 4, or the like, is installed as a memory module RAM in the LSI 40 in FIG. 5A. Further, the reset terminal RST of the memory module RAM is directly connected to the external reset terminal 41 of the LSI. That is, the memory reset signal MRST must be supplied via the external terminal 41 in order to reset the memory module RAM and, in response to the input of the memory reset signal MRST from the system side on which the LSI 40 is mounted, a memory module RAM performs a reset operation. In the case of this LSI, when the redundant select signal RSEL is supplied via the external terminal 41, the redundant memory block in the memory module becomes accessible as described above. Further, the data terminal group D0 to D30 of the memory module RAM is outputted as the external terminal of the LSI. Therefore, in the primary test at the wafer stage, by inputting the memory reset signal MRST to the external reset terminal 41, only the normal memory blocks are selected and subjected to an operation test. Further, by inputting a redundant select signal RSEL to the external reset terminal 41 in the primary test, the redundant memory block is rendered accessible and undergoes an operation test. Further, during normal operation, the memory reset signal MRST is inputted to reset the memory module RAM.

Figure 5B:
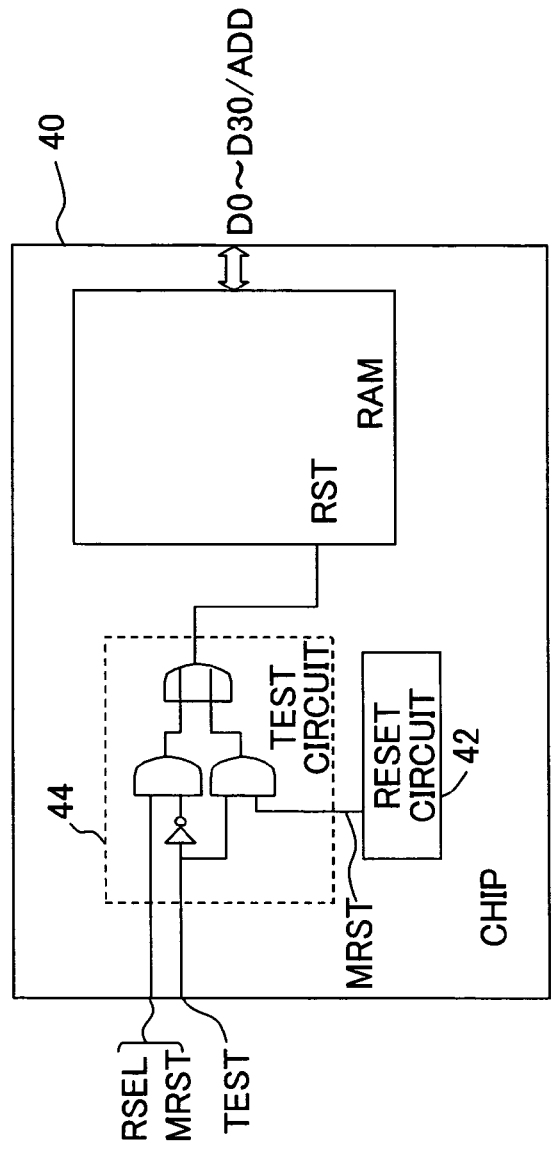

The LSI in FIG. 5B has a built-in memory module RAM and is provided with a built-in reset circuit 42 that generates the memory reset signal MRST. The reset circuit 42 generates the memory reset signal MRST internally when the power supply is turned on and when another reset is to be performed. Further, in user mode, a test signal TEST from outside the LSI is afforded a high level and the test circuit 44 supplies the memory reset signal MRST generated by the reset circuit 42 to the reset terminal RST of the memory module RAM to perform a normal memory operation. On the other hand, in test mode, the test signal TEST is rendered a low level signal and the test circuit 44 inputs the memory reset signal MRST or redundant select signal RSEL from outside to the reset terminal RST of the memory module RAM. Further, at the primary-test stage, only the normal memory block is selected and afforded an accessible state in response to the memory reset signal MRST and thus undergoes an operation test. Further, when the redundant select signal RSEL is inputted at the primary-test stage, the redundant memory block is selected and afforded an accessible state and undergoes an operation test. Further, the test signal TEST is set at the high level in the normal operational state and the memory reset signal of the reset circuit 42 is supplied to the reset terminal RST of the memory module RAM.

In either example in FIG. 5, the memory reset signal MRST can be inputted to the reset terminal RST of the memory module to establish a normal operational state and the redundant select signal RSEL can be inputted to the reset terminal RST to afford the redundant memory block a selected state. Therefore, the memory module need not be provided with a terminal for the selection of the redundant memory block other than the reset terminal that is required for the reset operation.

Figure 6:
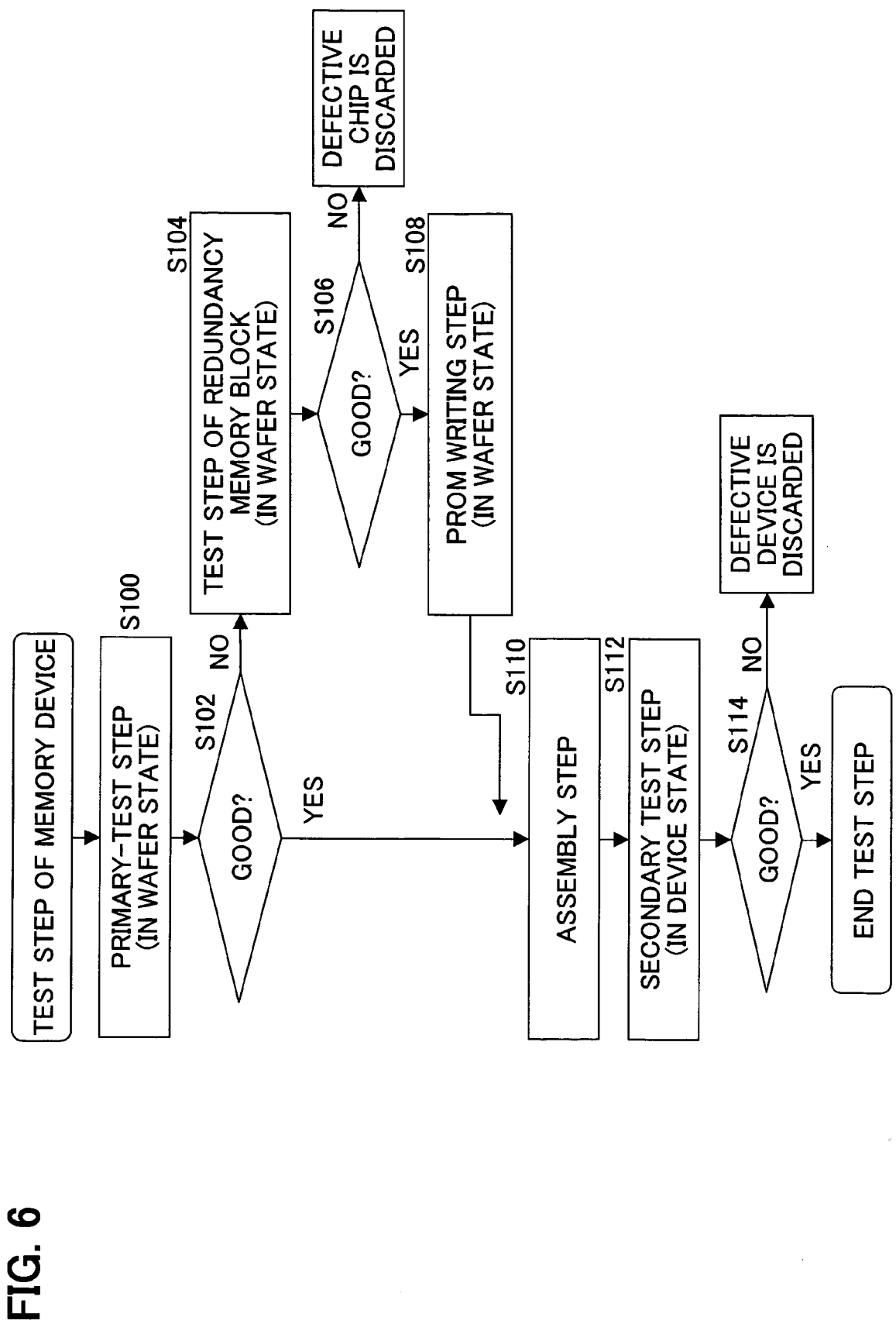
FIG. 6 is a flowchart that illustrates the test steps of the semiconductor memory of this embodiment.

FIG. 6 is a flowchart that illustrates the test steps of the semiconductor memory of this embodiment. In the primary-test step (S100) in the wafer state, the memory reset signal MRST is inputted to the reset terminal, whereby only the normal memory blocks are selected and undergo an operation test. A chip in which all the normal memory blocks have been judged as good (S102) is then assembled in step S110. On the other hand, a chip in which a fault has been found has the redundant select signal RSEL inputted to the reset terminal thereof in the wafer state to select the redundant memory block and undergoes an operation test (S104). In a case where the redundant memory block is defective, the chip is discarded as being defective. When the redundant memory block is judged to be good (S106), identification information such as the address of the normal memory block in which a fault was detected is written in the redundant replacement memory in order to save the chip (S108). This procedure is also performed at the wafer stage. When the redundant replacement memory is a PROM comprising fuse cells, identification information is written by burning out the fuses by means of a laser beam or the like.

Thereafter, in the assembly step S110, a chip is sealed in a package and completed as a semiconductor memory device. Further, a secondary test is performed in the state of the semiconductor memory device (S112). The operation test in the secondary test is performed with respect to normal memory blocks in the case of a faultless chip and with respect to faultless normal memory blocks and the redundant memory block in the case of a faulty chip. In the secondary test, the memory reset signal MRST is inputted to the reset terminal 41 and, in accordance with the redundant replacement memory identification information, only the normal memory block group or the normal memory block group and the redundant memory block are afforded a selected state. A device that is judged as being good in the secondary test (S114) is ultimately shipped from the factory as a good product. A device that is judged as being defective in the secondary test is discarded.

Figure 7:
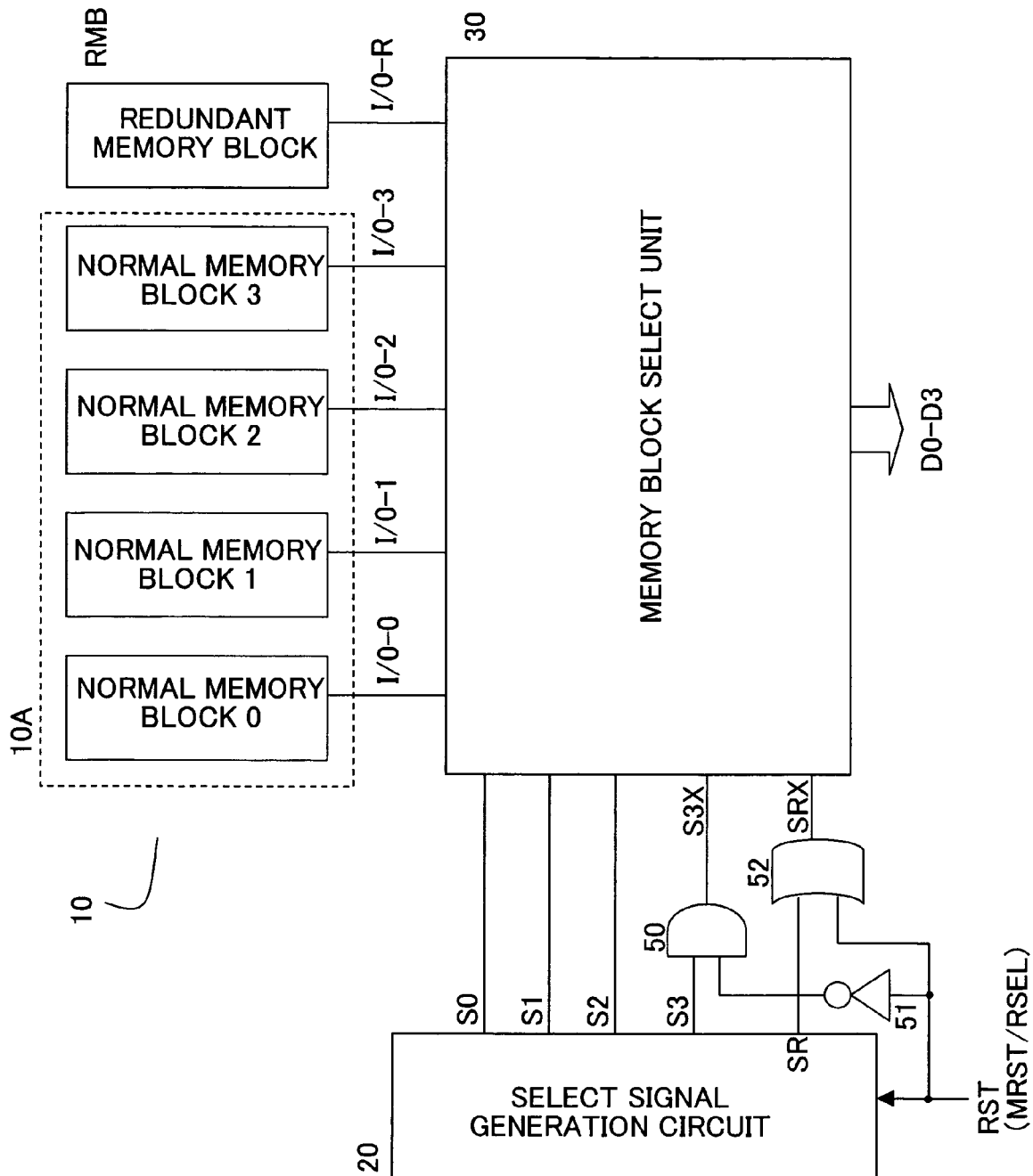
FIG. 7 is another constitutional view of the semiconductor memory of this embodiment.

FIG. 7 is another constitutional view of the semiconductor memory of this embodiment. This semiconductor memory has four normal memory blocks MB0–MB3 and one redundant memory block RMB provided in the memory core 10 for the sake of simplicity. Further, the select signal generation unit 20 renders four select signals among the block select signals S0 to S3 and SR high level signals. For example, when a fault does not exist in the normal memory blocks MB0–MB3, all the block select signals S0 to S3 are high level signals and the block select signal SR is a low level signal and the input/outputs I/O-0 to 3 from the normal memory blocks are connected to the data terminals D0 to D3. On the other hand, when a fault exists in the normal memory block 0, for example, the block select signal S0 assumes the low level and the block select signals S to S3, S4 assume the high level on the basis of the redundant replacement memory identification information (not shown), whereby the input/outputs I/O-1 to 3 of the normal memory blocks MB1, MB2, MB3 and the input/output I/O-R of the redundant memory block RMB are connected to the data terminals D0 to D3.

An AND gate 50, inverter 51 and OR gate 52 are also provided. When a high-level signal is inputted to the reset terminal RST, in cases where the redundant replacement memory is in the initial state, a block select signal S3X is forced to the low level via AND gate 50 and the redundant block select signal SRX is forced to the high level via OR gate 52. That is, if the redundant replacement memory is in the initial state, the block select signals S0 to S3 are all rendered high-level signals and the redundant block select signal SR is rendered a low-level signal. However, when a high-level redundant select signal RSEL is inputted to the reset terminal RST, the block select signal S3X assumes the low level and the redundant block select signal SRX assumes the high level. Hence, the redundant memory block RMB is compulsorily connected to the data terminal D3 in place of the normal memory block 3. The redundant memory block therefore becomes accessible and an operation test on the redundant memory block becomes feasible.

Further, similarly to the case in FIGS. 1 and 4, in response to the rising edge of a signal that is inputted to the reset terminal RST, a reset pulse (not shown) is generated and information for the redundant replacement memory is latched.

As detailed hereinabove, according to this embodiment, identification information for the redundant replacement memory of the memory is latched and a redundant select signal that differs from the memory reset signal for initialization is supplied to the reset terminal required for initialization to generate a memory block select signal and the compulsory selection of the redundant memory block is rendered possible together with initialization. Therefore, a memory reset signal can be inputted to the reset terminal to perform an operation test on the normal memory block and a redundant select signal can be inputted to the reset terminal to perform an operation test on the redundant memory device.

What is claimed is:

1. A semiconductor memory having a plurality of normal memory blocks and a redundant memory block, comprising:
    a redundant replacement memory that stores identification information for a normal memory block that is a replacement target;
    a select signal generation unit that generates a block select signal on the basis of the redundant replacement memory identification information in response to a memory reset signal inputted to a reset terminal; and
    a memory block selection unit that selects the redundant memory block and enables input/output access thereto in place of the replacement-target normal memory block on the basis of the block select signal,
    wherein the memory block selection unit selects the redundant memory block in place of any normal memory block in response to a redundant select signal which is inputted to the reset terminal and differs from the memory reset signal.

2. The semiconductor memory according to claim 1, wherein, when the redundant replacement memory is in an initial state, the redundant replacement memory does not store the identification information;
    the select signal generation unit generates the block select signal that does not direct replacement with the redundant memory block; and
    the memory block selection unit selects the redundant memory block in response to the redundant select signal inputted to the reset terminal instead of selecting the redundant memory block on the basis of the block select signal that does not direct the replacement.

3. The semiconductor memory according to claim 1, wherein the select signal generation unit generates, in response to the redundant select signal in addition to the memory reset signal, a block select signal on the basis of the redundant replacement memory identification information.

4. The semiconductor memory according to claim 1, wherein the select signal generation unit latches the redundant replacement memory identification information in response to the memory reset signal.

5. The semiconductor memory according to claim 1, wherein the memory block selection unit comprises:
    a plurality of selectors, provided corresponding with the normal memory blocks respectively, that select either the input/output of the corresponding normal memory block, or the input/output of the normal memory block adjacent to the corresponding normal memory block or the redundant memory block,
    wherein, in response to the block select signal, the memory block selection unit selects the input/output of the redundant memory block without selecting the input/output of the replacement-target normal memory block.

6. The semiconductor memory according to claim 5, wherein the memory block selection unit further comprises:
    a plurality of NOR gates that correspond with the normal memory blocks respectively,
    wherein the block select signal is inputted to the corresponding NOR gate together with the output of the previous-stage NOR gate and the output of the NOR gate is supplied as a select signal to the corresponding selector; and
    the redundant select signal is inputted to any of the plurality of NOR gates.

7. The semiconductor memory according to claim 6, wherein the memory reset signal is one pulse signal and the redundant select signal is a signal that retains the high level after the rising edge thereof.

8. The semiconductor memory according to claim 1, wherein the select signal generation unit generates a plurality of normal block select signals that select the normal memory blocks and a redundant block select signal that selects the redundant memory block;
    when the redundant replacement memory is in the initial state, the select signal generation unit causes the plurality of normal block select signals a selective state and causes the redundant block select signal a nonselective state; and
    in response to the redundant select signal, any normal block select signal is caused to be the nonselective state and the redundant block select signal is caused to be the selective state.

9. An integrated circuit device with a built-in memory module, the memory module comprising:
    a memory core that includes a plurality of normal memory blocks and a redundant memory block;
    a redundant replacement memory that stores identification information for a normal memory block that is a replacement target;
    a select signal generation unit that generates a block select signal on the basis of redundant replacement memory identification information in response to a memory reset signal inputted to a reset terminal; and
    a memory block selection unit that selects the redundant memory block and enables input/output access thereto in place of the replacement-target normal memory block on the basis of the block select signal, wherein the memory block selection unit selects the redundant memory block in place of any normal memory block in response to a redundant select signal which is inputted to the reset terminal and differs from the memory reset signal.

10. The integrated circuit device according to claim 9, wherein the reset terminal of the memory module is connected to an external terminal.

11. The integrated circuit device according to claim 9, further comprising:

a reset circuit that generates the memory reset signal, wherein the memory reset signal that is generated by the reset circuit, and a memory reset signal and redundant select signal from an external terminal are selectively supplied to the reset terminal of the memory module.

12. The integrated circuit device according to claim 9, wherein the select signal generation unit latches the redundant replacement memory identification information in response to the memory reset signal.

* * * * *